United States Patent
Wall et al.

(10) Patent No.: US 6,507,923 B1
(45) Date of Patent: Jan. 14, 2003

(54) INTEGRATED MULTI-CHANNEL FIBER CHANNEL ANALYZER

(75) Inventors: Timothy A. Wall, Big Lake; Eric D. Seppanen, Brooklyn Center; Steven Bucher, Minnetonka; Daniel G. Kuechle, Ramsey, all of MN (US)

(73) Assignee: I-Tech Corporation, Minneapolis, MN (US)

( * ) Notice: Subject to any disclaimer, the term of this patent is extended or adjusted under 35 U.S.C. 154(b) by 0 days.

(21) Appl. No.: 09/294,935

(22) Filed: Apr. 19, 1999

(51) Int. Cl.[7] .......................... G01R 31/28; G06F 7/02; H03M 13/00
(52) U.S. Cl. ....................................... 714/712; 714/821
(58) Field of Search ................................ 714/717, 712, 714/821

(56) References Cited

U.S. PATENT DOCUMENTS

| | | | |
|---|---|---|---|
| 4,777,330 A | * 10/1988 | Nakayashiki et al. | 178/69 R |
| 4,949,252 A | 8/1990 | Hauge | 364/200 |
| 5,247,517 A | 9/1993 | Ross et al. | 370/85.5 |
| 5,274,648 A | 12/1993 | Eikill et al. | 371/21.2 |
| 5,276,529 A | 1/1994 | Williams | 358/406 |
| 5,309,428 A | * 5/1994 | Copley et al. | 370/245 |
| 5,315,580 A | 5/1994 | Phaal | 370/13 |
| 5,363,366 A | * 11/1994 | Wisdom, Jr. et al. | 370/245 |
| 5,365,513 A | * 11/1994 | Copley et al. | 370/253 |
| 5,375,159 A | * 12/1994 | Williams | 379/23 |
| 5,390,188 A | * 2/1995 | Dawson | 714/717 |

(List continued on next page.)

OTHER PUBLICATIONS

Xyratex Press Release, "Xyratex shows Fibre Channel Protocol Analyzer Plus (PA+) At IBC", Sep. 11, 1998 3 pages.
Xyratex Press Release, "New Fibre Channel Protocol Analyzer", Oct. 17, 1997, 3 pages.

(List continued on next page.)

*Primary Examiner*—Albert Decady
*Assistant Examiner*—Joseph D. Torres
(74) *Attorney, Agent, or Firm*—Patterson, Thuente, Skaar Christensen, P.A.

(57) ABSTRACT

An integrated multi-channel Fiber Channel analyzer provides coordinated and cooperative triggering and capture of data across multiple channels in a Fiber Channel network. The integrated multi-channel analyzer accommodates up to sixteen separate analyzer channels in a single cabinet. Each analyzer channel is comprised of an input port connection to the Fiber Channel network, a trace buffer memory that captures data and logic circuitry that controls the operation of the trace buffer memory in response to a status condition. A high speed status bus is connected to each analyzer channel and propagates the status conditions of each analyzer channel to all other analyzer channels. In this way, the integrated multi-channel analyzer allows for distributive control over triggering decisions across multiple analyzer channels, and also allows for multi-level triggering where different conditions may be detected by different analyzer channels. Analysis of the data captured by the integrated multi-channel analyzer is further enhanced by a processor resident in the cabinet that is connected by a data/control bus to each analyzer channel and by a hardware search engine associated with each trace buffer memory. The resident processor receives high level commands from a remote host processor and sends selected trace data to the remote host computer over an Ethernet connection.

20 Claims, 9 Drawing Sheets

U.S. PATENT DOCUMENTS

| | | | |
|---|---|---|---|
| 5,406,566 A | 4/1995 | Obara | 371/21.2 |
| 5,414,712 A * | 5/1995 | Kaplan et al. | 714/712 |
| 5,442,639 A | 8/1995 | Crowder et al. | 371/20.1 |
| 5,444,695 A * | 8/1995 | Copley et al. | 370/452 |
| 5,457,694 A * | 10/1995 | Smith | 714/712 |
| 5,465,250 A * | 11/1995 | Brief | 370/249 |
| 5,526,283 A | 6/1996 | Hershey et al. | 361/514 C |
| 5,535,193 A * | 7/1996 | Zhang et al. | 370/253 |
| 5,590,116 A * | 12/1996 | Zhang | 370/253 |
| 5,600,632 A * | 2/1997 | Schulman | 370/252 |
| 5,602,827 A * | 2/1997 | Lindeborg et al. | 370/223 |
| 5,648,965 A | 7/1997 | Thadani et al. | 370/241 |
| 5,761,424 A | 6/1998 | Adams et al. | 395/200.47 |
| 5,812,529 A | 9/1998 | Czarnik et al. | 370/245 |
| 5,923,673 A * | 7/1999 | Henrikson | 714/712 |
| 6,243,834 B1 | 6/2001 | Garrett | 714/37 |
| 6,335,931 B1 | 1/2002 | Strong et al. | |

OTHER PUBLICATIONS

Xyratex Web Site, "Fibre Channel Test and Development System", 1998, 3 pages.

Ancot Web Site, "Introducing the FCA–5010 Fibre Channel Analyer", undated, 2 pages.

Finisar Press Release, "Analyzer multiple points in Fiber Channel network with new multiport protol analyzer", Sep. 16, 1998, 2 pages.

Finisar Web Site, "Fibre Channel Gigabit Traffic System", undated, 2 pages.

Finisar Web Site, "GLA 3100 Gigabit Link Analyzer", undated, 3 pages.

I–TECH Product Flyer, "IPC–2000 Portable Test System—PassPort Portable Test Chassis", undated, 2 pages.

I–TECH Product Flyer, "IPC–8580 Ultra2 SCSI Analyzer", 11/97, 4 pp.

I–TECH Product Flyer, "IFC–20 Fibre Channel Analyzer", 11/97, 4 pages.

I–TECH Web Site, "Fact Sheet IFC–20 Fibre Channel Analyzer", 11/97, 3 pages.

Clariion Web Site, "Clariion Service Powertools", 08/98, 5 pages.

FuturePlus Web Site, "Fibre Channel Bus Analysis Probe Preliminary Information", 04/98 3 pages.

Finisar Web Site, "App Note GT–A98A Multianalyzer Feature", undated, 2 pages.

* cited by examiner

INTEGRATED MULTI-CHANNEL FIBER CHANNEL ANALYZER

FIELD OF THE INVENTION

The present invention relates generally to the field of diagnostic equipment, testers and analyzers for use with communication interfaces among computing devices. More specifically, the present invention relates to an integrated multi-channel analyzer for a Fibre Channel network that provides coordinated and cooperative triggering and capture of data across multiple channels.

BACKGROUND OF THE INVENTION

Analyzers are used as diagnostic and testing tools at various stages of the development, integration and maintenance of electronic computing devices. Typically, an analyzer is designed for use with a particular electrical communication interface protocol, such as ATA, SCSI, Ethernet or Fibre Channel. In a typical use, the analyzer is connected to one or two ports of the communication interface of the computing system being tested to record communication activity on the interface. The communication activity is captured and recorded in a dedicated trace buffer associated with the analyzer, and then analyzed and/or presented to the user for the purpose of diagnosing, testing or maintaining the communication interface.

Analyzers designed for the Fibre Channel protocol must overcome significant technical challenges due to the extremely high bandwidth and high data transfer rates that are supported by the Fibre Channel communication interface. Examples of existing Fibre Channel protocol analyzers include the I-Tech IFC-20 Fibre Channel Analyzer, the Xyratex TP-5-100-PA+ Fibre Channel Protocol Analyzer Plus, the Ancot FCA-5010 Fibre Channel Analyzer, the FuturePlus Systems Fibre Channel Bus Analysis Probe, and the Finisar GT-A Fibre Channel Protocol Analyzer. In each of these Fibre Channel protocol analyzers, the analyzer is provided with a pair of channels that connect to the input and output ports, respectively, of a single computing device on the interface. These analyzers are equipped with various triggering, filtering and capture mechanisms that are designed to identify, capture and store the data of interest at the particular device to which the analyzer is connected. While it is conventional to refer to an analyzer as being "triggered" in order to capture the data of interest, it should be understood that what the analyzer actually does is continuously store all of the data going by the analyzer, and then the signal to "trigger" the analyzer effectively stops this continuous capture so that the data remaining in the buffer of the analyzer is the data of interest. Once captured, the data can then be analyzed to determine the source of problems in the communication interface for that particular device or to optimize the performance of the communication interface for that particular device.

While existing Fibre Channel analyzers work well at debugging communication protocol problems at the particular device to which the analyzer is connected, they do not work well to track down problems or to optimize the communication interface across multiple computing devices in a large Fibre Channel network. Large Fibre Channel network installations can consist of tens to hundreds of computing devices linked over many miles of communication cables and often located at sites that are physically distant from one another. Because of the existing limitation in current Fibre Channel analyzers of only being able to connect to the input and output ports of a single device, analysis of a problem in a large Fibre Channel network requires the use of multiple analyzers. Unfortunately, there is no convenient way of integrating the data from multiple ones of these analyzers in order to make the analysis and presentation of data about such a problem a simple or straightforward matter.

In the I-Tech-IFC-20 Fibre Channel analyzer, for example, monitoring of more than a single device requires the use of multiple analyzers. All of the analyzers must be independently connected to each of the multiple devices and must be independently programmed for triggering and filtering conditions. In order to allow one analyzer to trigger another analyzer to capture data, a trigger sync out of the first analyzer must be connected to a trigger sync in of the second analyzer. Although it is possible to arrange multiple analyzers in this manner, it is difficult and time consuming to set up because the analyzers are not designed for any type of coordinated arrangement. Moreover, it has been discovered that the kinds of problems encountered in large complex multi-device Fibre Channel communication networks are very often too complicated for such a simplistic arrangement as having a trigger sync out signal of one analyzer connected to the trigger sync in signal of a second analyzer. For example, in Fibre Channel networks that allow for multiple paths over which data packets may travel between a source and destination, monitoring the actual path that any given data packet may be taking becomes less and less predictable as the complexity of the network interconnections increases.

Once this type of multiple analyzer arrangement in the prior art has been set up and triggered, data from the two analyzers is time correlated by a time stamping arrangement to allow for comparison by a host processor of data captured by the pair of channels in the first analyzer with the data captured by the pair of channels in the second analyzer. The time stamped data is then separately downloaded from each analyzer and the host processor is used to correlate arid evaluate the captured data. Examples of the use of time stamping to coordinate multiple communication analyzers for communication interfaces other than a Fibre Channel protocol are shown in U.S. Pat. Nos. 5,535,193 and 5,590,116. U.S. Pat. Nos. 5,276,579 and 5,375,159 describe examples of protocol analyzers for telecommunication data networks that include the ability to remotely operate and coordinate the analyzers. U.S. Pat. No. 5,600,632 describes performance monitoring using synchronized network analyzers in which the data from all of the analyzers is aggregated and sorted chronologically before it is analyzed.

While existing Fibre Channel analyzers are adequate for trouble shooting single Fibre Channel devices, there is a need for a Fibre Channel analyzer that addresses the problems of existing Fibre Channel analyzers when attempting to analyze complicated, large multi-device Fibre Channel networks and provides for a more integrated solution to analyzing large and complicated Fibre Channel networks.

SUMMARY OF THE INVENTION

The present invention is an integrated multi-channel Fibre Channel analyzer that provides coordinated and cooperative triggering and capture of data across multiple channels in a Fibre Channel network. The integrated multi-channel analyzer accommodates up to sixteen separate analyzer channels in a single cabinet. Each analyzer channel is comprised of an input port connection to the Fibre Channel network, a trace buffer memory that captures data and logic circuitry that controls the operation of the trace buffer memory in response to a status condition. A high speed status bus is connected to each analyzer channel and propagates the status conditions of each analyzer channel to all other analyzer channels. In this way, the integrated multi-channel analyzer allows for distributive control over triggering decisions across multiple analyzer channels, and also allows for multi-level triggering where different conditions may be detected by different analyzer channels.

Analysis of the data captured by the integrated multi-channel analyzer is enhanced by a processor resident in the cabinet that is connected by a data/control bus to each analyzer channel and its associated trace buffer memory. The resident processor receives high level commands from a remote host processor and coordinates the way in which the analyzer channels are configured to monitor the Fibre Channel network. Once trace data is captured in one or more of the trace buffer memories, the resident processor coordinates the transfer of relevant portions of the trace data to the remote host processor. To reduce the amount of data that must be transferred to the remote host processor, each analyzer channel preferably includes a hardware search engine that can quickly and efficiently identify relevant data patterns in the trace buffer memory. Once the trace data has been captured in the trace buffer memories, the resident processor initiates a time indexing routine that uses the hardware search engine in each analyzer channel to index the trace data for that analyzer channel.

Because all of the trace data in all of the analyzer channels has utilized a common clock to establish the time stamping, the resident processor can quickly identify and download data segments from the trace buffer memories of different analyzer channels to the remote host processor without the need for an intermediate step of time stamp synchronizing this data. In addition, the resident processor is capable of performing initial analysis on the trace data internal to the multi-channel analyzer. These distilled results of the analysis may be communicated from the resident processor to the remote host processor over a relatively small bandwidth communication channel, such as an Ethernet connection, without the need for a large bandwidth communication channel in order to download massive amounts of raw data to the host processor as was required in the prior art. Moreover, the use of a common clock for storing the trace data removes the burden on the host processor of time-stamp collating this massive amount of raw data based only on the coordination of periodic sync pulses as provided for in the prior art.

Preferably, the analyzer channels of the multi-channel analyzer are configured with two analyzer channels per analysis logic card with a local bus on the analysis logic card providing cross access between the input port and trace buffer memories of both analyzer channels. The logic circuitry of each analyzer channel also preferably comprises a pair of field programmable gate arrays that implement a trac engine that controls triggering and operation of the analyzer channel and a memory control/filtering function gate array that controls memory access and filtering functions performed by the analyzer channel. The trac engine is preferably comprised of a pair of trac processors that each execute a unique set of analyzer instructions downloaded from the resident processor. Unlike existing analyzers, the trac engine provides for enhanced flexibility by allowing the analyzer instructions to be assembled and organized in such a manner as to allocate varying amounts of the functionality of each trac processor to monitor for different conditions. The utilization of two trac processors per trac engine allows each analyzer channel to create more complex multi-level triggering conditions.

In a preferred embodiment, each analysis logic card is plugged into both a frontplane and a backplane. The frontplane interfaces the input port connection to the Fibre Channel network with the analyzer channel. The input port connection is preferably a module designed to interface to the particular Fibre Channel environment through industry standard converters. The backplane interfaces the analyzer channel with the high speed status bus and the data/control bus and on through to the resident processor. The backplane also provides a system-wide clock that is distributed to each analyzer channel, thereby solving the problem of the lack of a common time base which confronts the prior art when multiple analyzers are hand-wired together using only simplistic trigger out and trigger in signals. As a result, it is not necessary for the multi-channel analyzer of the present invention to time stamp collate trace data from different analyzer.

DESCRIPTION OF THE PREFERRED EMBODIMENT

As a background for understanding the description of the preferred embodiment of the present invention, the way in which two existing Fibre Channel analyzers would be configured to monitor two separate devices on a Fibre Channel loop will be described. Thereafter, an overall description will be presented of how the preferred embodiment of the present invention operates to monitor two or more devices on a Fibre Channel loop in an integrated manner, thereby allowing for combinatorial triggering across multiple ports and more efficient monitoring of a large scale Fibre Channel communication interfaces. Finally, a detailed description of the hardware and software of the preferred embodiment of the present invention will be presented.

Fibre Channel is a channel/network standard which contains network features that provide the required connectivity, distance, and protocol multiplexing for a communication network. The Fibre Channel architecture represents a true channel/network integration with an active, intelligent interconnection among devices provided with a pair of Fibre Channel ports. All a Fibre Channel port does is to manage a simple point-to-point connection. The transmission is isolated from the control protocol, so point-to-point links, arbitrated loops, and switched topologies are used to meet the specific needs of an application. For purposes of describing the preferred embodiment of the present invention, a working knowledge of the Fibre Channel communication interface as a packet transmission network is assumed. For a background on the Fibre Channel communication interface, reference is made to the Fibre Channel Industry Association materials, including the Fibre Channel tutorial available at www.fibrechannel.com.

Figure 1:
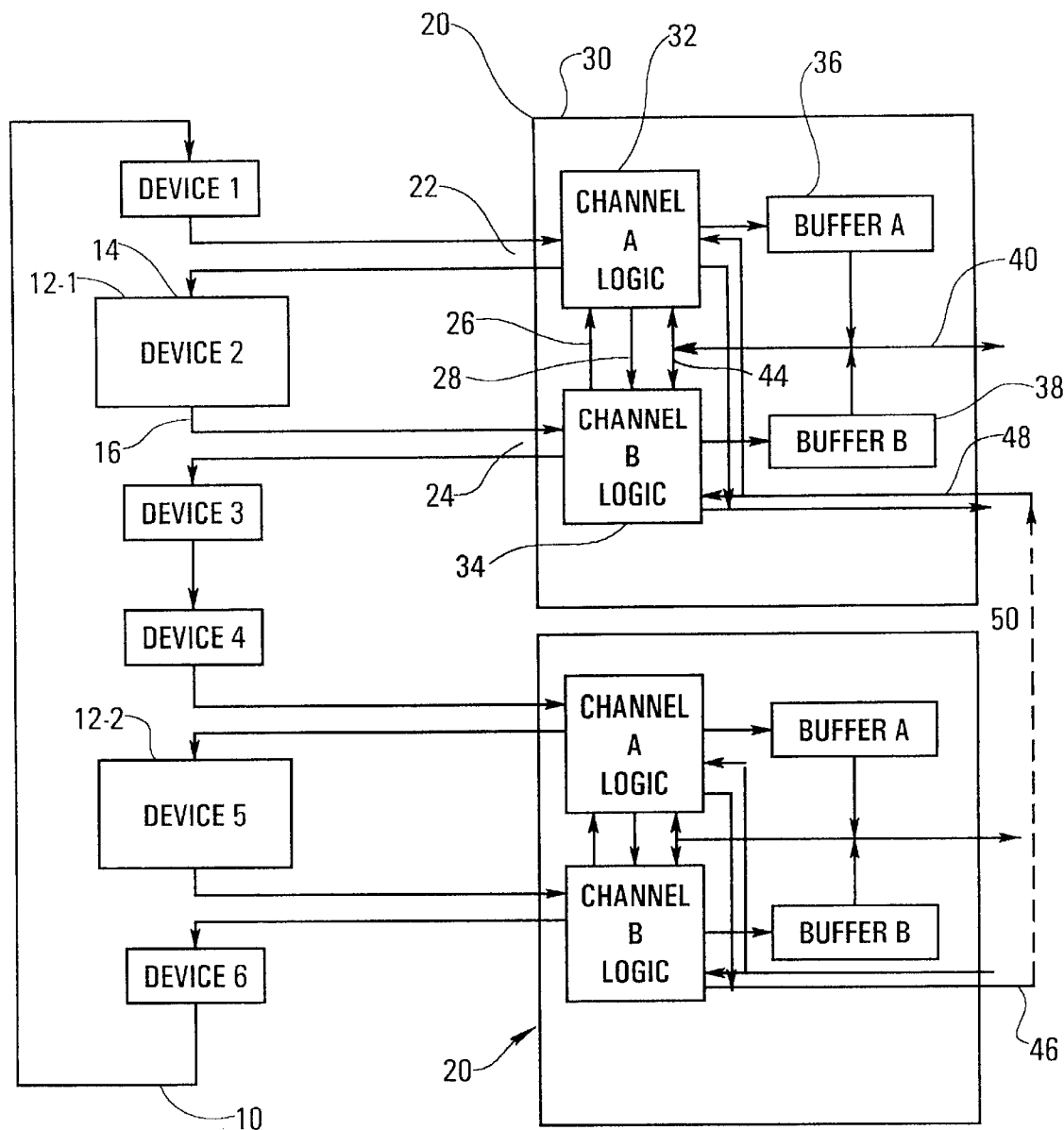
FIG. 1 is an overall block diagram showing how a prior art analyzer is configured to monitor two separate devices on a Fibre Channel communication interface.

A Fibre Channel communication interface 10 having multiple Fibre Channel devices 12 as part of a loop topology is shown in FIG. 1. In a Fibre Channel loop topology, the loop 10 is unidirectional in that each device 12 is connected on one side by an input or receive port 14 and on the other side by an output or transmit port 16. Each succeeding device 12 in the loop 10 is connected in a similar manner with the output port 16 of one device connected to the input port 14 of the next device in the loop 10. It will be understood that the loop topology shown in FIG. 1 is a simplified electrical topology that does not. show the complexity of connections that may be present in the particular implementation of a given topology.

In the prior art, when a single device 12-1 needs to be monitored a single Fibre Channel analyzer 20 having a pair of channels 22, 24 is connected to the receive port 14 and the transmit port 16 as shown so as to effectively straddle the device 12. In this way, analyzer 20 is able to monitor all message packets on the communication interface 10 that both enter and exit the device 12-1 on the loop 10. These connections are made by interposing each channel 22, 24 between a pair of adjacent devices 12, thereby creating a break in the loop 10 with the analyzer 20 bridging this break.

The basic structure of a prior art analyzer 20 as shown in FIG. 1 is typically implemented by populating a single circuit board 30 with the circuitry for a pair of channels 22, 24. Alternatively, a pair of circuit boards may be populated, one for each of the channels 22, 24. The circuitry for the first channel 22 (Channel A) includes channel logic 32 and an associated buffer memory 36. The circuitry for the second channel 24 (Channel B) includes channel logic 34 and an associated buffer memory 38. Each channel logic 32, 34 typically comprises the Fibre Channel interface retiming, deserialization, and 8B–10B decoding, as well as triggering logic, and buffer control logic. In addition, channel logic 32, 34 may also include filtering logic, error checking and other minor control functions. The channel logic 32, 34 and associated buffers 36, 38 are typically connected to a host processor (not shown) by a relatively large bandwidth bus 40. The bus 40 enables the host processor to set up triggering and filtering conditions within each channel logic 32, 34 and to download captured trace data from the buffers 36, 38. There is a pair of internal cross-channel connections 26, 28 between the channels 22, 24 that can selectively transfer data between the channels 22, 24. In addition to the bus 40, internal traces or interconnections 44 between channel logic 32, 34 are typically provided for on the circuit board 30 to coordinate the operation of the two channels 22, 24. In the paired channel approach utilized by the prior art, both of the channels 22, 24 must meet the predetermined trigger condition for that channel in order for the analyzer 20 to be triggered to capture the recorded data packets in both of the trace memories 36, 38. As Fibre Channel communication interfaces have grown larger, there have been occasions when it is necessary to utilize more than one analyzer 20 in order to track down a problem within a large Fibre Channel loop 10. It is also necessary to utilize more than one analyzer 20 for devices 12 which have dual ports, meaning that the device has two identical interfaces, each interface being connected to a different loop 10. Because commands to a given device 12 may be sent over either of the loops 10, the ports for each loop must both be monitored which requires two analyzers 20. In either of these situations, multiple analyzers 20 are used in a hand-wired arrangement with the operator selectively tying the trigger out signal 46 from one analyzer 20 to the trigger in signal 48 of another separate analyzer 20, as shown for example at 50. Unfortunately, there are at least two major problems with this approach in the prior art.

First, there is no consistent unified definition of what "time" is from one analyzer 20 to another. In a typical prior art configuration having multiple analyzers 20 hand-wired together as shown in FIG. 1, the analyzer 20 sending the trigger out signal 46 would also send a periodic sync pulse, for example, every 1 millisecond, to all other connected analyzers 20. Each analyzer 20 will be running its own clock at a similar, but not identical frequency. The analyzers 20 receiving the periodic sync pulse use this pulse to coordinate the relative time stamping of captured data within the margins created by the internal drift of the clock frequency of that analyzer in between sync pulses. No actual coordination of the circuitry of the hand-wired analyzers 20 is enabled, however, by virtue of using such a sync pulse.

Second, there is very little flexibility or adaptability of this type of arrangement in terms of the combinatorial relationships among triggering events at different analyzers. As can be seen from FIG. 1, the relationships among triggering events are severely constrained by the fact that there is only one trigger out signal 46 and one trigger in signal 48 for each channel pair 22, 24. As such, it is not possible to individually trigger only one of the channels in the channel pair 22, 24 because the trigger in signal 46 for analyzer 20 triggers both channels 22, 24. Similarly, it is not possible to base the trigger out signal 48 on an event seen at only one of the channels in the channel pair 22, 24 because the trigger out signal 48 is wire OR'd together for the channel pair 22, 24. It is also not possible to allow for multiple triggering events, to provide for distributed control over the triggering process among multiple channels or to make selective triggering decisions based on the identity of a channel. It is important to understand that the paired arrangement of channels 22, 24 within a single analyzer 20 essentially has been dictated to date by the manner in which devices 12 are physically interconnected to a Fibre Channel network 10. Data traffic for any given device 12 is always split between two data paths, the receive port 14 and the transmit port 16. As will be described, the conventional manner for physically connecting devices 12 into a Fibre Channel network 10 relies on a paired connection of the receive port 14 and transmit port 16 in order to establish what appears to a user as a single duplex cable connection of the device 12 to the Fibre Channel network 10.

Figure 2:
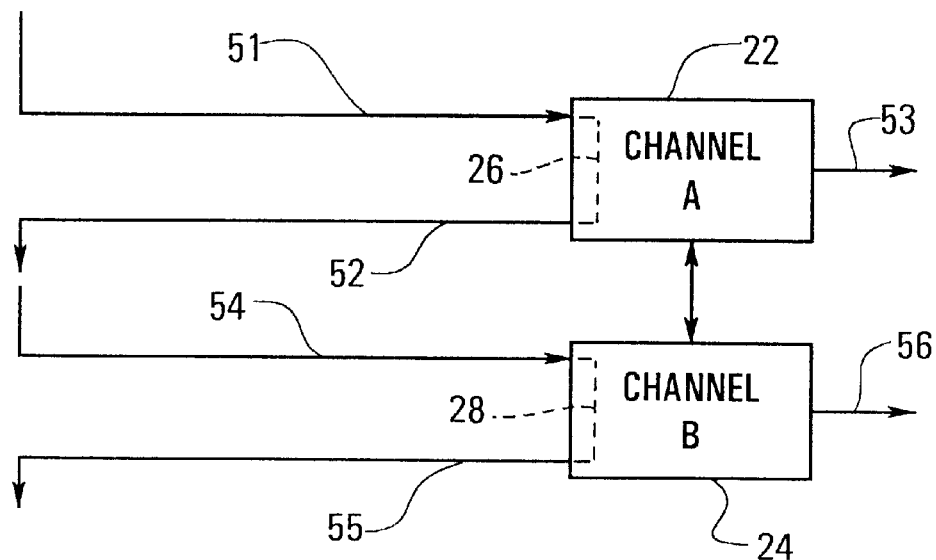
FIG. 2 is a simplified schematic diagram showing the internal data path connections for the prior art analyzer of FIG. 1.

FIG. 2 shows how the data paths within the channel A logic 22 would internally route the data for the configuration shown in FIG. 1. Data from the receive port is routed into an input port 51 onto internal cross channel connection 26 and out through an output port 52, with a copy of the data from the receive port 14 essentially being "stolen" or copied from this internal transfer at a tap port 53 for use by the channel A logic 22. Similarly, the data for the transmit port is internally routed from an input port 54 onto internal cross channel connection 28 and out through an output port 55 with a copy to be used by the channel B logic 24 taken from tap port 56.

Figure 3:
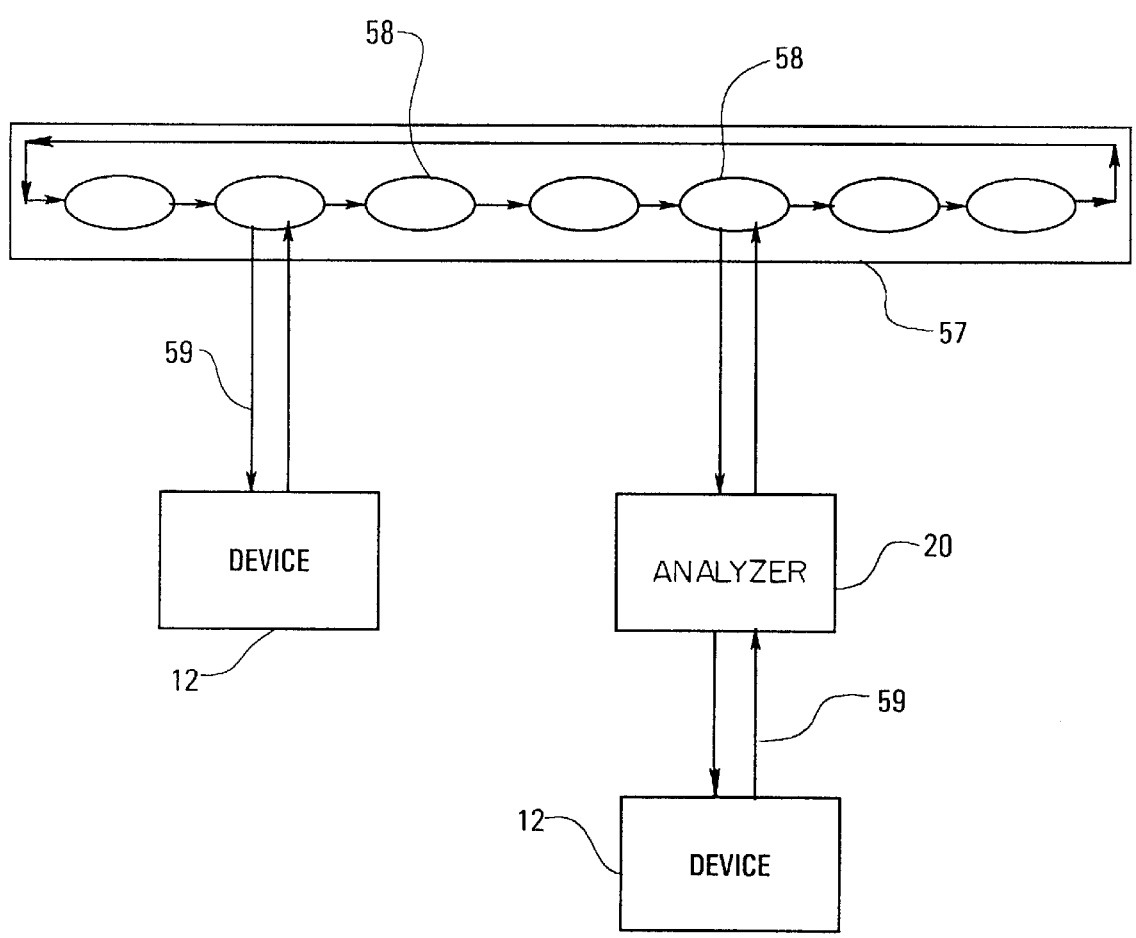
FIG. 3 is a block diagram showing a hub connection for a conventional Fibre Channel network utilizing the prior art analyzer of FIG. 1.

While the physical connection of a Fibre Channel network 10 is shown in the manner described in FIGS. 1 and 2 for purposes of more easily understanding the flow of data around the network, in practice it is more conventional for a Fibre Channel network 10 to be physically interconnected as shown in FIG. 3. Typically, a Fibre Channel network is comprised of one or more hubs 57. Each hub 57 has an arbitrated loop comprised of multiple sockets 58 into which a duplex cable 59 is connected to hook devices 12 into the Fibre Channel network 10. The arbitrated loop of the hub 57 allows a user to create a completed loop, even though there may be empty sockets 58 because the hub senses whether there is a device 12 connected to each socket 58 and, if not, the arbitrated loop bypasses sending data to that socket and routes the data within the hub to the next socket 58.

Figure 4:
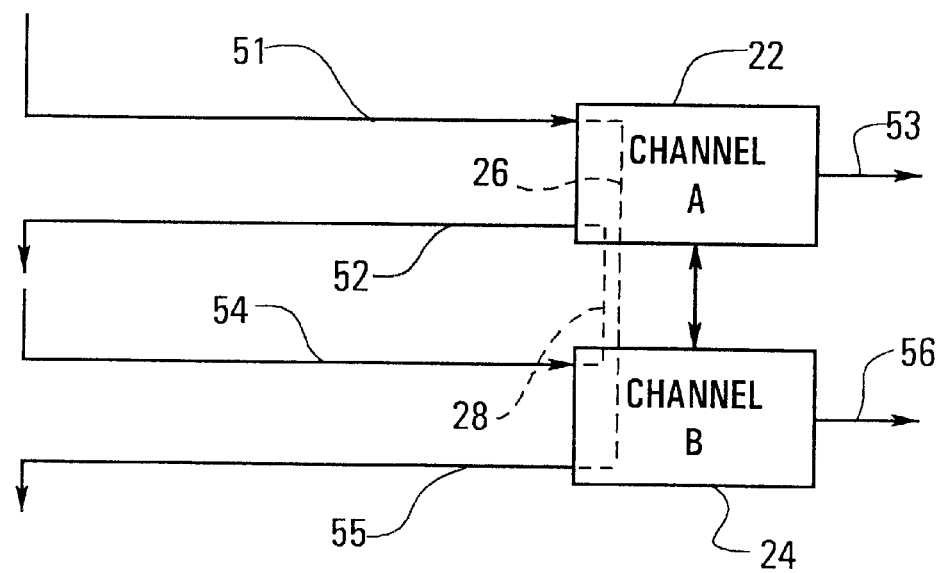
FIG. 4 is a simplified schematic diagram showing the internal data path connections for the prior art analyzer when configured with a hub connection as shown in FIG. 3.

When it is necessary to connect an analyzer 20 into this type of a hub configuration for a Fibre Channel network 10 as shown in FIG. 3, the analyzer 20 is interposed between the hub 57 and the device 12 using a pair of duplex cables 59. In order to simply accommodate this type of physical connection, the internal routing of the data within the analyzer 20 is different than as shown in FIG. 2. As can be seen in FIG. 4, the internal connections within the analyzer 20 are modified such that the data into input port 51 of channel 22 (channel A) is internally routed via cross channel 26 out of the output port 55 of channel 24 (channel B). Similarly, the data into the input port 54 of channel 24 (channel B) is internally routed via cross channel connection 28 out of the output port 52 of channel 22 (channel A). By using this manner of internal routing of the cross channel connection data paths 26, 28 between the paired channels 22, 24, it is possible to simply connect the analyzer 20 between the hub 57 and the device 12 by using two duplex cables 59, without forcing the user to be concerned with the actual one-way routing of the data that must be done in order to maintain the integrity of the loop that forms the Fibre Channel network 10.

As a result of these limitations in the prior art and the reliance upon the paired nature of the physical interconnection of devices 12 to hubs 57 within a Fibre Channel network 10, there has been no general motivation or opportunity to date to develop a Fibre Channel analyzer 20 having more than a pair of channels 22, 24 that can be arranged in any kind of combinatorial triggering other than the single trigger in/trigger out arrangement found in the prior art.

Figure 5:
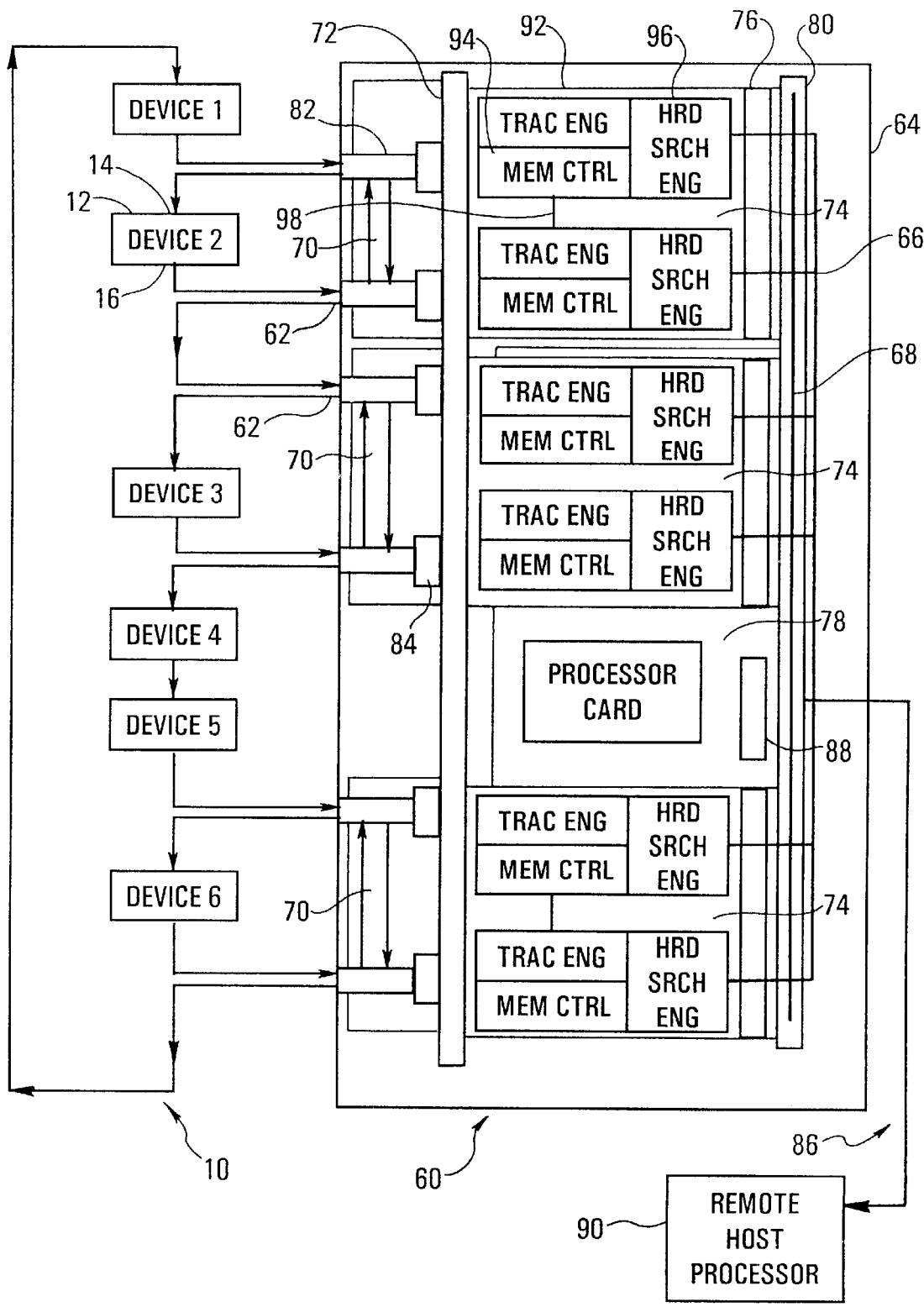
FIG. 5 is an overall block diagram showing a preferred embodiment of the present invention monitoring multiple devices on a Fibre Channel communication interface.

Referring now to FIG. 5, an overall block diagram of an integrated multi-channel analyzer 60 for a Fibre Channel communication network in accordance with the present invention will now be described. Unlike existing paired-channel analyzers 20, the preferred embodiment of the multi-channel analyzer 60 provides for up to sixteen separate analyzer channels 62 within a chassis in a cabinet 64. The cabinet 64 serves as a housing for encasing the components of the integrated multi-channel analyzer 60, preferably within a chassis in the cabinet, as a single piece of equipment. A resident processor 78 housed within the cabinet 64 has an external connection 86 that receives high level commands from a remote host processor 90 for configuring and controlling the multi-channel analyzer 60. At least three channels 62 are housed within the cabinet 64, although preferably a minimum of four analyzer channels 62 are provided for in multi-channel analyzer 60. Each channel 62 includes an input connection port 82 to connect to the Fibre Channel communication network 10, a trace buffer memory 76 and logic circuitry 74. The logic circuitry 74 controls selective write operations of traces from the input connection port 82 to the trace buffer memory 76 in response to a status condition for that channel 62. The integrated analyzer 60 provides a 160–640 MB/channel trace memory capable of being segmented into smaller trace memories. This facilitates the concept of unattended batch mode capture without the need to download jumbo sized traces. Trace memory may also be sparingly used if so chosen by enabling the many trace filters available as will be described.

A high speed status bus 66 connects to each of the channels 62 to propagate status conditions for that channel 62 to all other channels 62. This high speed status bus 66 allows the multi-channel analyzer 60 to distributively control the status condition, including the trigger and memory control capture parameters, in a cooperative manner across the analyzer channels 62. A data/control bus 68 connects each of the channels 62 and the processor 78 for the purpose of sending low level commands from the processor 78 to the channels 62. The data/control bus 68 transfers output from selective read operations of traces in the trace buffer memories 76 from the channels 62 to the processor 78. As described in further detail below, both the high speed status bus 66 and the data/control bus 68 are preferably implemented over a backplane 80, although it will be understood that cabling or other equivalent connections among the channels 62 for these busses 66, 68 could also be utilized.

By providing for distributive control of the triggering and operation within each analyzer channel 62 based on the status conditions of not only that channel, but also the status of any other analyzer channels 62 within the multi-channel analyzer 60, the present invention provides for true combinatorial triggering across more than two channels. The multi-channel analyzer 60 of present invention is the first to provide analyzer channels with the ability to communicate with one another beyond sending and receiving the simple fact that a pair of channels has been triggered. The distributive communication of status conditions among the analyzer channels enables cooperative operational decisions across analyzer channels in addition to conventional triggering and capture decisions, such as suspend capture, resume capture, or any other operations of which the analyzer channel is capable. Examples of the manner in which the multi-channel analyzer 60 can be configured to perform these multi-channel combinatorial status operations will be described in further detail after the details of the hardware architecture of the integrated multi-channel analyzer 60 are described.

With continuing reference to FIG. 5, there are three distinct sections of logic which comprise the architecture of the analyzer 60 of the present invention. These are the front-end modules 70 and an associated frontplane board 72, the channel analysis logic cards 74 and associated trace memory daughter boards 76, and the micro-processor cards 78 and a backplane 80. The front-end modules 70 and logic cards 74 are added in pairs of channels as each card supports two channels' 62 worth of their respective group of functions.

In the preferred embodiment for each pair of channels 62 there is a front-end module 70 connected to a frontplane board 72. The front-end module 70 provides for connection from a Fibre Channel environment, (point-to-point, fabric, arbitrated loop) to the analyzer 60 made through the use of industry standard GBIC (Gigabit Interface Converter) modules 82. GBIC modules 82 offer the user the capability to easily convert the analysis port for a given channel 62 from a copper to optical channel and vice-versa. To allow for hot swapping of the modules, the GBIC modules 82 slide into one of sixteen small docking ports 84. There are two of these docking ports 84 per front-end module card 70.

The analysis logic card 74 and trace memory daughter board 76 which plugs onto the card 74, supports two channels and plugs into a backplane board 80. All logic cards 74 acquire a copy of the main system clock through the backplane 80. As such there is no need for time reference pulses to synchronize trace data from multiple channels. In the preferred embodiment, each of the analysis logic cards 74 is configured to support a pair of channels 62 through a pair of trace buffer memories 76 and a pair of logic circuits 74. Each channel logic circuit 74 controls selective write operations of traces from one of the input connection ports on the GBIC modules 82 to an associated one of the trace buffer memories 76 in response to a status condition for that channel 62.

Preferably, each of the channel logic circuits 74 is comprised of a pair of field programmable gate arrays (FPGA), a first FPGA that implements a trac engine FPGA 92 for that channel 62 and a second memory control/filtering FPGA 94 that implements a memory control/filtering logic for the channel 62. A set of local interconnections referred to as a local bus 98 between the pairs of FPGAs 92, 94 on each analysis logic card 74 is also provided. This local bus 98 is separate from the high speed status bus 66 and the data/control bus 68 such that the FPGAs 92, 94 of one channel 62 can access the trace buffer memory 76 and the connection ports 82 of the other channel 62 resident on the same analysis logic card 74.

In the preferred embodiment of the logic circuitry 74, a hardware search engine 96 is provided for each channel 62 so as to minimize the amount of trace data that is required to be transferred first to the processor 78 and ultimately to the host processor 90 by allowing the hardware search engine to perform a hardware search of the trace buffer memory 76 in response to parameters provided by the host processor 90 via the processor 78 of the multi-channel analyzer. For a more detailed description of the preferred embodiment of the hardware search engine 96, reference is made to the co-pending application entitled "DEEP TRACE MEMORY SYSTEM FOR A PROTOCOL ANALYZER", Ser. No. 09/193,779, filed Nov. 17, 1998, which is commonly assigned to the assignee of the present invention and the disclosure of which is hereby incorporated by reference.

In a preferred embodiment, the resident processor 78 automatically initiates a time indexing routine in the first few seconds after a trace has been completed utilizing the hardware search engines 96 of each of the channels triggered by the trace. The resident processor 78 repeatedly instructs the hardware search engine of each analyzer channel 62 to identify the location of data at specific time periods away from the triggering event (e.g., +/−1, 2, 3, 5, 10, 15 seconds, etc.). These locations are then stored by the resident processor 78 for each analyzer channel 62 in a time index. When a command from the remote computer 90 requests information on all data at a given time period, the resident processor 78 locates the relevant portions of the trace buffer memory 76 for each of the associated analyzer channels using the time index and downloads that trace information first over the data/control bus to the memory in the resident processor 78, and then over the Ethernet connection to the remote host computer 90. Unlike the prior art, there is no need for the remote host computer to time-stamp collate massive amounts of raw data based only on the coordination of periodic sync pulses because all of the trace data in the trace buffer memories 76 has been time-stamped with a common clock signal.

System control of the integrated analyzer 60 is accomplished through the use of a processor card 78 that is plugged into the backplane board 80 piggyback style. The processor card 78 supports a 10/100 Mb/s Ethernet connection 86 with the aid of a small Ethernet board 88 connected to it via a forty-pin ribbon cable. The Ethernet connection allows a separate host computer 90 to issue high level commands to the system processor on the processor card 78. The processor card 78 preferably includes a high performance 133 MHz Pentium processor, 256 KB cache, and 32 MB of DRAM and is more than capable of offloading from the host computer 90 the intensive data mining chores that arise from the 16 channel, deep memory, multi-channel configurations possible with the integrated analyzer 60. In addition to post processing chores, with the advanced logic circuitry 74 of the integrated analyzer 60, real time statistics and monitoring will be another area in which the system processor on the processor card 78 is called upon to assist in managing to collect accurate and timely data for upload to the host computer 90.

In the preferred embodiment, the backplane board 80 is capable of accepting up to eight logic/memory card pairs that use a 96 pin, VME style two piece connector system and two 80 pin connectors into which the processor card 78 is plugged. The backplane connectors are grouped into 2 columns of four connectors. Each group of four is connected to its own system interface bus that uses the IDE signals and protocol as the preferred embodiment of the broad band bus 68. The processor card 78 has an IDE interface to the data/control bus 68.

In the preferred embodiment, there are actually two high speed status busses 66, which are directly or through a buffer, common to all eight connectors on the backplane 80. They are both synchronous to the 26 MHz system clock and are 16 bits wide. Each analyzer channel 62 will be assigned one of the 16 lines of each of these status busses 66 to drive based on a slot ID for that particular connector and a channel ID for the particular channel on the logic card 74. All channels 62 have the capability to listen to each other's signaling driven over these lines. One of the two busses 66 is called the ERT or "Extreme Real Time" bus. This bus carries information which an effective L_PORT Filtering mechanism uses as described hereinafter. The second bus called CRT or "Controlled Real Time" bus is used for the logic circuitry 74 and the ganging of trace buffer memories 76 from multiple channels 62. The CRT bus also requires the use of a synchronizing line, RT_SBIT, which is free running and pulses high every fourth clock cycle. RUN_SBIT is another synchronizing line, which after enabling the appropriate channels, toggles high then low to start the channels' record logic in a synchronized fashion. There are a handful of other signals for LEDS, a common external IN and a common external OUT which can be programmed for hi-active or lo-active operation. The two external lines are accessible from the front of the integrated analyzer 60 and use standard BNC connectors with TTL logic levels that terminate to a 50 ohms resistive load (EXT IN).

Aside from the busses 66, 68 described above, the backplane board 80 is the origin of the system clock. Preferably, the system clock is intentionally fast in that its frequency of 26.5685 MHz at +−100 ppm will always reside above the fastest Fibre Channel word rate of 26.5625 MHz+100 ppm. This design choice forces all channel receive fifos on each front-end module 70 to operate at their almost empty boundary and minimize word skew between channels. This clock is individually distributed to each logic card 74, processor card 78 and to EXT IN logic using a serial termination technique.

The operation of the high speed status bus 66 for the CRT bus will now be described. As indicated, each of the 16 lines of the CRT bus is driven by an individual channel 62. Using RT_SBIT, each line of the CRT bus is divided in time into 4 separate time slots, three of which are reserved for a 3-bit code indicative of one of eight possible trigger codes for that channel 62, and the fourth of which is multiplexed between a quick going signal indicative of that channel 62 having been triggered, and a slow going signal indicative of a 'memory full' condition that informs other channels that the trace buffer 76 of that channel 62 is almost full. Such a slow going signal may be used in cases where two or more channels 62 have been programmed by the resident processor 78 to pool their trace buffer memories 76 to form a larger trace buffer space. In operation, each analyzer channel 62 is configured to send out a predetermined status code based on the combinatorial operation of the channels that is desired. For example, channels 1, 2, 4 and 6 may be programmed to send out a "7" status code when they encounter a trigger condition in the trace data on that channel 62. Another set of channels 62, for example, channels 1, 4, 5, and 7 are programmed to utilize the existence of any other channel sending out a "7" status code as part of the operational mode, such as a trigger condition, for those channels. In addition, the logic circuitry 74 of each channel 62 is also capable of masking the codes on the CRT bus for any of the channels 62. This allows for more advanced combinatorial operation based on selective channel combinations within the multi-channel analyzer 60.

Figure 6:
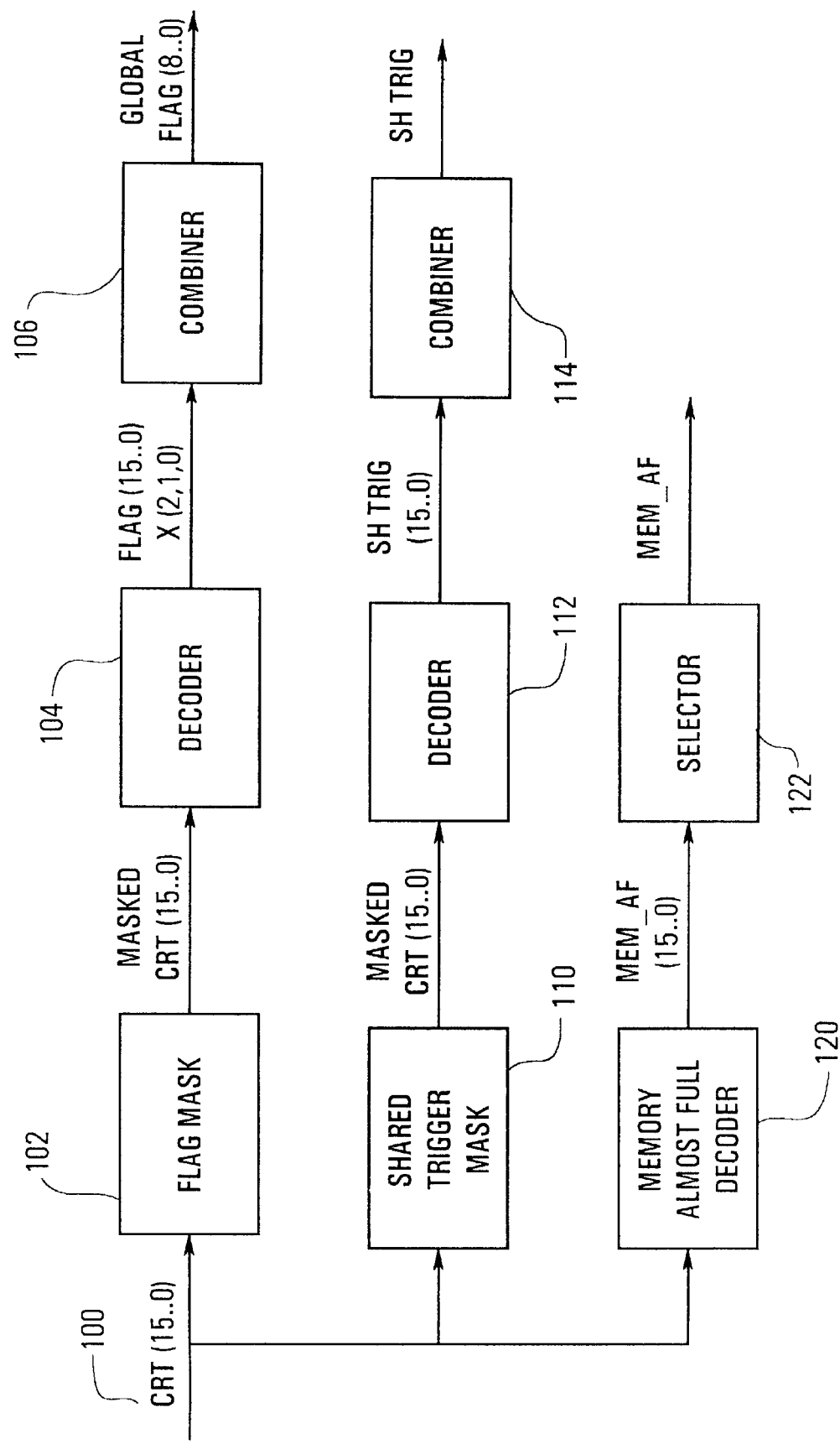
FIG. 6 is a detailed block diagram of the preferred embodiment of the decoding of the high speed status bus of the present invention.

Referring now to FIG. 6, a more detailed description of the operation of the preferred embodiment distributively controlled combinatorial logic is presented. As shown at 100, the CRT bus includes time slot allocations corresponding to all sixteen analyzer channels 62. The CRT bus carries three types of signals: Global Flags, Shared Triggers and Memory Almost Full Flags.

The Global Flags are decoded by each analyzer channel 62 in the sequence shown starting at 102. The CRT bus is passed through a mask at 102 that blocks signals from those channels that are programmed to be ignored. At 104, the three global flag lines in the CRT bus are decoded from each CRT bus wire for each channel by a decoder, yielding a total of 48 signals. At 106, these 48 signals are then put together by a combiner to produce eight Global Flag Bits used by the analysis logic card 74, each Global Flag Bit representative of the presence/absence on the CRT bus of a corresponding three bit code (i.e., Global Flag Bit 3=a three-bit code of '011' was present on at least one of the non-masked channels of the CRT bus).

The Shared Triggers are decoded by each analyzer channel 62 in the sequence starting at 110. Like the Global Flags, the Shared Triggers pass through a mask at 110 that blocks signals from those channels that are programmed to be ignored for this analyzer channel 62. It will be noted, however, that the system has the flexibility of using a different set of masks for the Shared Trigger masks than the masks for the Global Flags. The fourth wire of the CRT bus is then decoded by a fast-going decoder at step 112 to produce sixteen shared trigger signals. These shared trigger signals are logically OR'd together by a combiner at step 114 to produce a shared trigger signal that is used by the analysis logic card 74.

The Memory Almost Full Flags are decoded in the sequence starting at 120. Here the fourth wire of the CRT bus is decoded by slow-going decoder at 120 that ignores the fast-going signals of the Shared Trigger and decodes only a much slower transition signal on the fourth wire for each of the sixteen channels. Because the Memory Almost Full Flag is not a time sensitive signal, the analysis logic card 74 singles out at 122 a selected channel as programmed by the resident processor 78 which controls any potential combination of the trace buffer memory 76 of this analyzer channel 62 with the trace buffer memory of another analyzer channel 62. That selected channel is then assigned to the Memory Almost Full Flag for the analysis logic card 74 for that analyzer channel 62.

While the preferred embodiment of the high speed bus 66 in the form of the CRT bus has been described in terms of a time division multiplexed multiple wire bus, it will be understood that alternative implementations are also contemplated to be within the scope of the present invention as long as the performance and characteristics of the operation of such alternate embodiments is consistent with the performance and characteristics necessary to accomplish the distributively controlled operation of the multi-channel analyzer 60 of the present invention. For example, it may be possible to increase the frequency of the time division of the CRT to allow for all of the signals to be carried upon a single path. Alternatively, the number of wires in the data path could be increased to accommodate additional analyzer channels in the cabinet or to form multiple rings or layers of analyzer channels within a multiple cabinet embodiment, for example.

Figure 7:
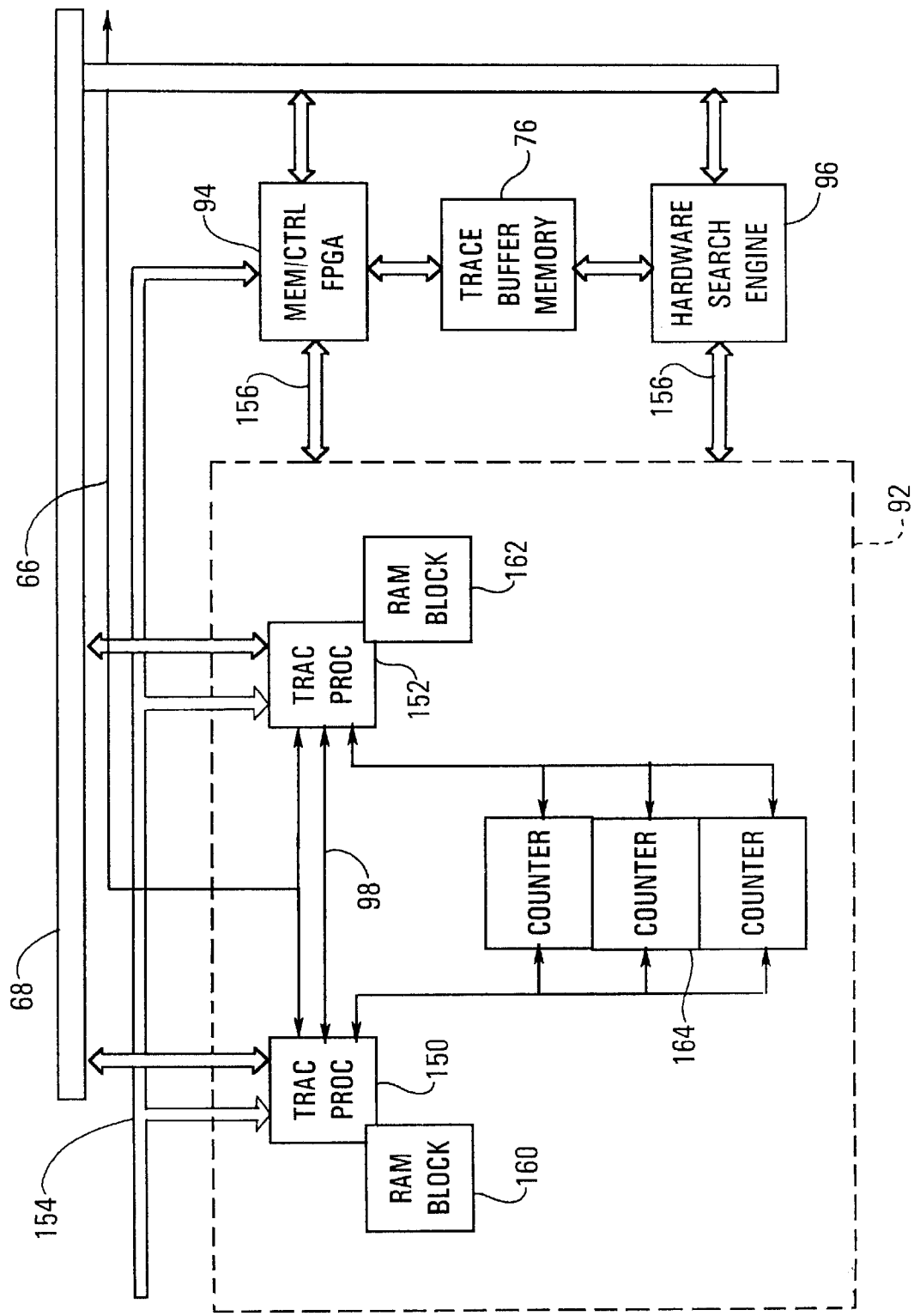
FIG. 7 is a detailed block diagram of the preferred embodiment of the trac engine circuitry within the analyzer channel of the present invention.

Referring now to FIG. 7, the preferred embodiment of the trac engine FPGA 92 will be described in further detail. The trac engine FPGA 92 is preferably comprised of a pair of trac processors 150, 152 that each execute a unique set of analyzer instructions downloaded from the resident processor 78. Unlike existing analyzers, the trac engine FPGA 92 provides for enhanced flexibility by allowing the analyzer instructions to be assembled and organized in such a manner as to allocate varying amounts of the functionality of each trac processor 150, 152 to monitor for different conditions. The utilization of two trac processors 150, 152 per trac engine FPGA 92 allows each analyzer channel 62 to create more complex multi-level triggering conditions.

Each trac processor 150, 152 is connected to the front end module 70 (FIG. 5) via a data path 154 that routes the Fibre Channel data to each trac processor 150, 152. This data path 154 is also connected to the second FPGA 94 which controls the routing of the data to the trace buffer memory 76. It should be understood that the trace buffer memory 76 is actually continuously written with all of the Fibre Channel data going by the analyzer. The status condition signal that "triggers" the analyzer channel effectively stops this continuous capture so that the data remaining in the trace buffer memory 76 of the analyzer channel is the data of interest in response to the status condition. The first trac engine FPGA 92 interfaces with the second FPGA 94 using memory/control signals as shown at 156. The trac processors 150, 152 also interface with the local flags 98 and the high speed status bus 66. The trac processors 150, 152 are also connected with the data/control bus 68.

Each trac processor 150, 152 is connected to a corresponding random access memory (RAM) block 160, 162 into which the instructions for operation of the trac processor are loaded by the resident processor 78. A common pool of various counters 164 is also provided for both of the trac processors 150, 152. In one embodiment, these counters include eight 32 bit word counters, eight 32 bit loop counters, and eight 44 bit time counters. All counters 164 are indexed and controlled (enabled and compared) according to the instruction residing in the RAM blocks 160, 162. Counters 164 may be readable through the resident processor 78 so that statistical information may be gathered at the end of a program run (execution of a set of instructions across one or more channel analyzers) or during a pause within the program during runtime. Counters 164 may also be loadable through the resident processor 78 so that instructions can be evaluated based off a terminal count indicator for that counter.

One of the key advantages of utilizing two separate trac processors 150, 152 in the trac engine FPGA 92 is that this allows for greater flexibility in the creation of multi-level status conditions. In essence, the programming of the trac processors 150, 152 allows for the creation of a high level AND logical condition between two entirely separate subsets of conditions. Another key advantage of the trac processors 150, 152 of the present invention is that it provides for enhanced flexibility by allowing the analyzer instructions to be assembled and organized in such a manner as to allocate varying amounts of the functionality of each trac processor to monitor for different conditions. Each RAM block 160, 162 can accommodate up to 128 complex instructions. A user programming the trac engine FPGA 92 can allocate one small block of instructions for one trac processor to evaluate a first condition, and allocate a second larger block of instructions for the same trac processor to evaluate a second, more complex condition. For a more. detailed understanding of the programming operation of the trac engine FPGA 92, reference is made to Appendix A attached hereto which sets forth the programming manual for the trac engine FPGA 92.

In general, the operation and range of functionality of the second memory/control FPGA 94 is similar to filtering and memory logic control operations of prior art analyzers in that this FPGA 94 coordinates trigger detect, counter and multiplexer operations as well as filtering and memory control. The multi-channel nature of the integrated multi-channel analyzer of the present invention, however, has influenced the architecture of the memory/control FPGA 94 in that the preferred embodiment of the present invention provides minimal 10 B (ten bit/byte control encoding) trace support in a Fibre Channel storage area network, in favor of greater 8 B (eight bit/byte data encoding) support than is currently provided by prior art analyzers. This is because most network problems addressed by the integrated multi-channel analyzer of the present invention will be of the high-level exchange type. Should lower level errors occur such as those typically encountered in 10 B mode, a small scratchpad memory (256–512 words deep) in the memory/control FPGA 94 is utilized to capture a handful of such low level errors for inspection and one of the counters 164 is used to give indication of the frequency of such events.

The purpose of general filtering logic implemented by the memory/control FPGA 94 is to allow a user to quickly set up a filter mechanism that will limit the amount of data stored to trace buffer memory 76. The selections offered are of the most asked for and worthwhile variety. The other major reason for general filtering logic in the second memory/control FPGA 94 is to conserve the logic of the trac engine FPGA 92 for more advanced chores. General filtering in the memory/control FPGA 94 has comparators that will recognize common IU frame types. The four IU frame types for Fibre Channel protocols are CMND, XFER_RDY, DAT, and RSP. Any or all of these IU frame types may be captured to trace buffer memory 76. Additional parameters may be selected to further define filtering action for the individual IU frame types. These would be as follows: (i) CMND IU—Capture all command frames or a list of up to 8 user defined commands; (ii) DAT IU—Capture. complete frame (header & payload), capture header only, or capture header and user specified number of data words; and (iii) RSP IU—Capture all response frames or only abnormal response frames. In addition to the above, the memory/control FPGA 94 can be programmed by the resident processor to filter out user specified Ordered Sets such as R_RDY. Provisions can also be. made for general filtering of protocol types, (SCSI-FCP, IP, etc.), and ID filtering for point-to-point environments.

L_PORT Filtering logic is used in Fibre Channel Arbitrated Loop (FC_AL) environments when it is desired to eliminate all frames bound for the trace buffer memory 76 that are unrelated to the device under examination. It is logic in the second memory/control FPGA 94 that uses an algorithm to find the physical address (PA) assigned to it or agreed upon at Loop Initialization. Once the PA is found, filtering proceeds as it does in ID filtering in point-to-point environments. The algorithm is as follows: (i) hardware on a particular channel determines it was the first channel to see an OPN on the loop. This port is in the OPN state; (ii) the same channel waits and then latches the destination and source addresses from the first frame that channel sends (the source address is the PA for the above OPN port in step (i); and (iii) hardware on a different channel determines it was the first channel to see a CLS to be sent on the loop without previously seeing an OPN. This port had just exited the RCVD_CLS or OPND state. The destination address from step (ii) is the PA of this port that had been OPND. A mechanism then exists which relays the addresses to all channels via the data/control bus 68.

Often the most powerful and advanced features of a piece of test equipment like the integrated multi-channel analyzer 60 of the present invention go unused, for there is seldom a need for the average user to use these features. In addition, advanced features often are the most costly to include. A corrective design approach adopted by the present invention is to design for similarities between functions that rarely get used and those that often or could get regularly used. The similarities between filtering and monitoring are many with the main difference being the action they take and not the input and circuitry they use to determine the action to take. With this said, the trac engine FPGA 92 of the integrated analyzer of the present invention is designed as a general purpose, programmable resource for filtering and/or monitoring. A program of instructions is loaded into each of the RAM blocks 160, 162 of the trac engine FPGA 92. This program will update comparators on the words which to compare for, counters to enable/disable, flag indicators to be set or system interrupts to be generated. If filtering of such control is not called for, these resources should be put to use to monitor the Fibre Channel traffic and offer real time statistics to the user. For a more detailed explanation of the unique instruction set and manner of programming the analyzer channels 62 of the present invention, reference is made to Appendix A attached hereto which sets forth the programming manual for the trac engine FPGA 92.

Figure 8:
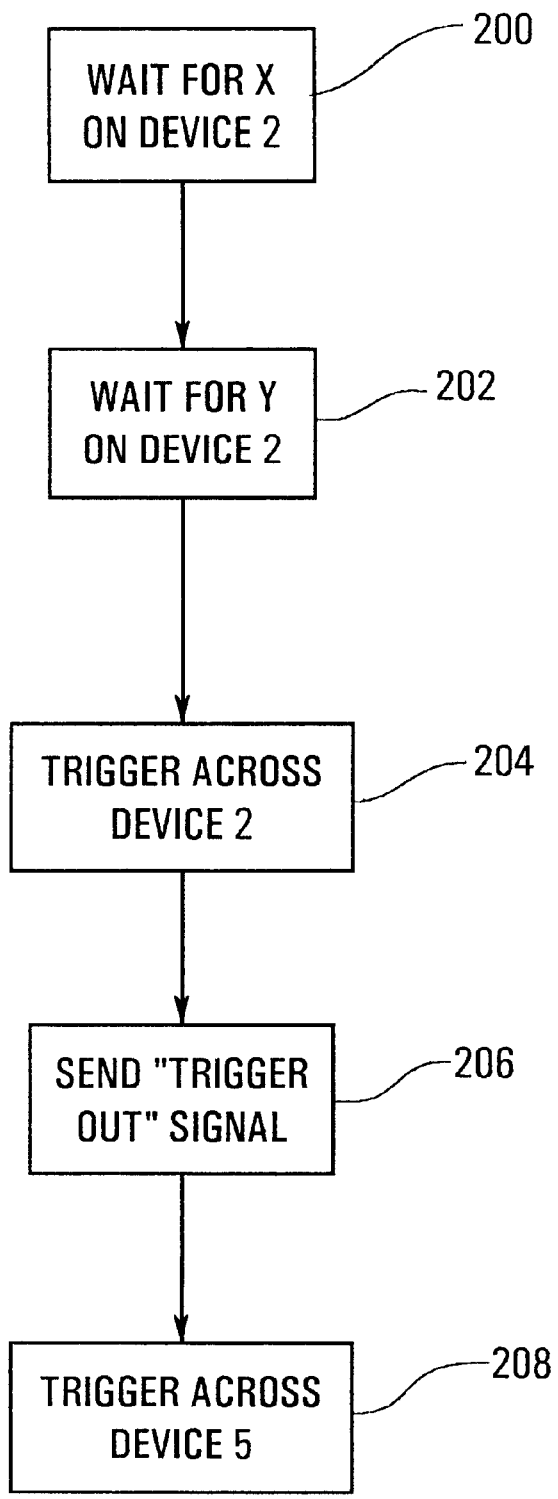
FIG. 8 is a flow diagram showing an example of the triggering operation of a pair of prior art hand-wired analyzers.
Figure 9:
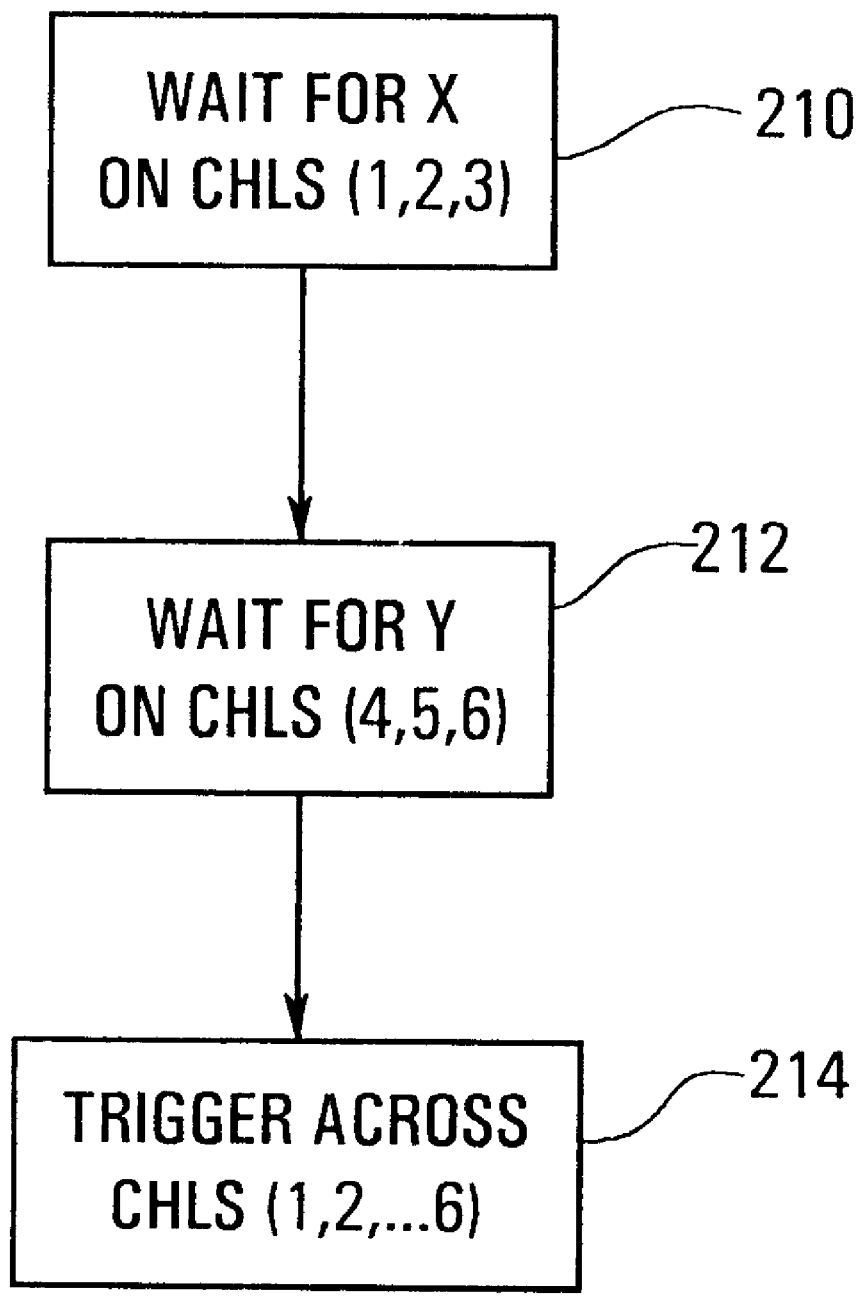
FIG. 9 is a flow diagram showing an example of the triggering operation of the multi-channel integrated analyzer of the present invention.

Referring now to FIGS. 8 and 9, a description of how the operation of the integrated analyzer 60 of the present invention as shown in FIG. 5 differs from the operation of the hand-wired combination of prior art analyzers 20 as shown in FIG. 1 will be presented. In the situation where a user wanted to monitor both Device 2 and Device 5 and trigger the two channel analyzers 20 to capture relevant data, the only way in which the prior art combination to two hand-wired analyzers 20 can be programmed is shown in FIG. 8. At step 200, the first analyzer is programmed to wait for a first event X to occur on either Channel A or Channel B, both of which are monitoring Device 2. At step 202, the first analyzer is programmed to trigger upon detection of a second event Y that may occur on either Channel A or Channel B across Device 2. Once the combination of event X and event Y have been detected on either Channel A or Channel B across Device 2, Device 2 is triggered at step 204. The trigger out signal 46 for the analyzer 20 monitoring Device 2 is set at step 206. Because the trigger out signal 46 is hardwired to the trigger in signal 48 for the analyzer monitoring Device 5, both Channels A and B across Device 5 are immediately triggered in response to the trigger in signal 48 for the channel analyzer 20 monitoring Device 5 at step 208. It can be easily appreciated from this flow diagram that there are few if any options for how data is to be captured by the prior art multiple analyzer arrangement.

In contrast to the limited options for multiple channel triggering as provided for in the prior art, the present invention, as shown in FIG. 9, provides for distributive control over the analyzer channels of the multi-channel Fibre Channel analyzer. In a similar situation to the scenario outlined in FIG. 8, the present invention is programmed to wait for two separate events, X and Y, prior to triggering a trace. The high level programming of the multi-channel analyzer of the present invention at the resident processor start at step 210 where a first specified group of channels are programmed to monitor for the first event X to occur on any of those channels. At step 212, a second specified group are programmed to monitor for the second event Y to occur on any of those channels. In the example shown in FIG. 9, there is no overlap between the first and second specified groups, however, such an overlap is also possible. Once event Y has occurred on any of the second'specified group of channels, then the multi-channel analyzer triggers the programmed channels of a third group to store a trace on each of those channels at step 214 using the global flags. While it is most likely that this third group of channels will include all of the first and second group of channels, or just the second group of channels, it should be understood that it is also possible to have the third group of channels be entirely separate from the channels chosen to monitor for events X and/or Y. It will also be seen that the channels in all three of these groups may be monitoring the same device or different devices in the Fibre Channel network.

In addition, it is also possible to take an action at step 214 that is different than merely triggering the group of third channels. Specifically, the present invention provides the flexibility to allow for other actions, such as suspend or resume, which can be used to selectively control the storage of frame data in the trace buffer memory prior to a final trigger condition that will stop all further storage of frame data in the trace buffer memory. An example of this situation might be where it is desired to capture frame data in the third group of channels only for a given number of frames after occurrence of a first condition X on the first group of channels, but the stopping of this capture of frame data should occur only after the occurrence of a second condition Y. In this example, the global flags established after condition X would specify a suspend and then a resume operation to allow for capture of the desired number of frames after occurrence of condition X, whereas the global flags established after condition Y would specify a trigger operation that would cease any further storage of frame data in the trace buffer memories.

Figure 10:
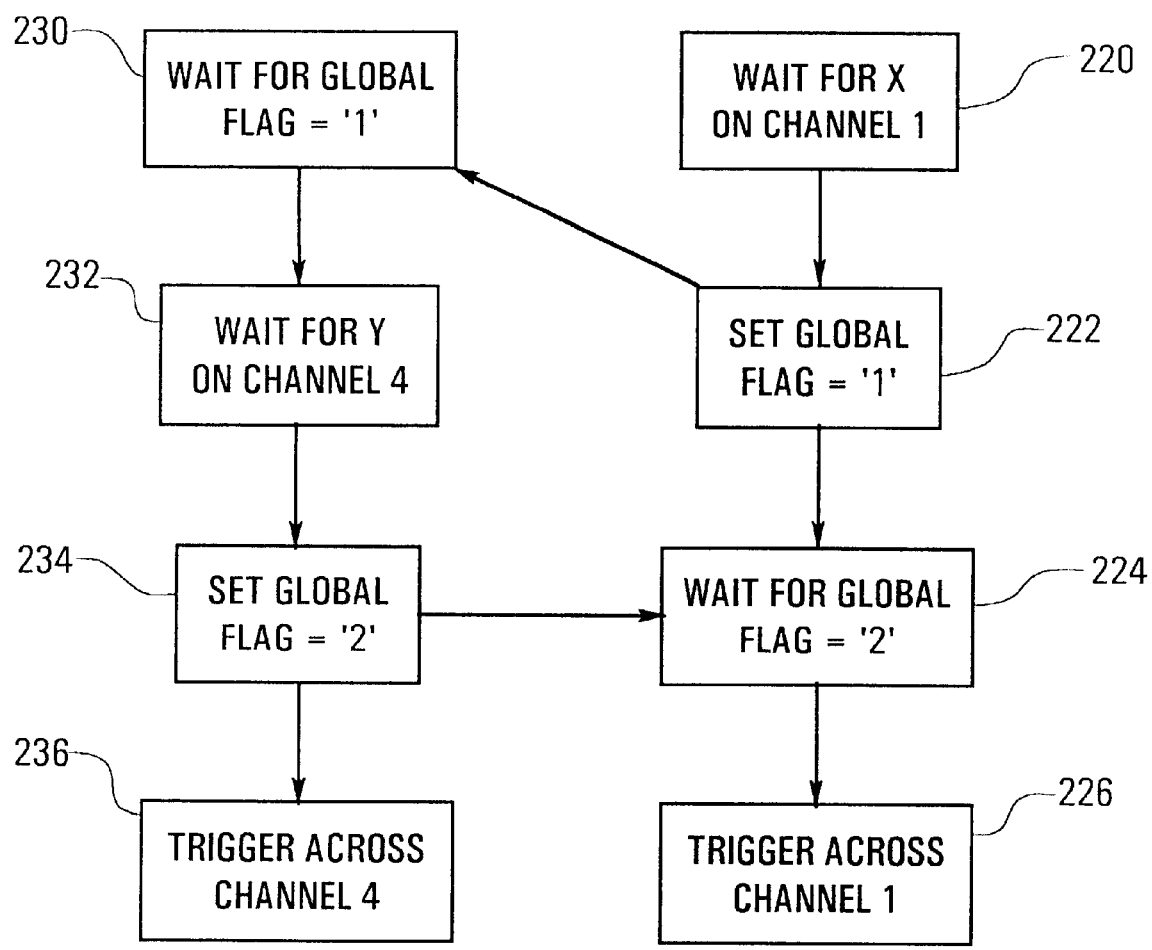
FIG. 10 is a more detailed flow diagram showing the operation of FIG. 9 for two separate analyzer channels.

The manner in which the global flags are utilized to implement the distributive control of the triggering operations is shown best by reference to FIG. 10. In this figure, the actual internal steps taken by two of the channels, one channel from the first group and one channel from the second group, are shown side-by-side. In this example, the third group of channels that are ultimately triggered include all of the channels in both the first and second groups as shown at step 214 in FIG. 9.

The actions for channel 1 are shown to the right of FIG. 10. At step 220, channel 1 waits for condition X. At step 222, once channel 1 has detected condition X, channel 1 sets its global flag to '1'. Then at step 224, channel 1 now waits for the global flag to be set to '2'. When this occurs, channel 1 is triggered at step 226. The actions for channel 4 are shown to the left of FIG. 10. At step 230, channel 4 waits for the global flag to be set to '1', which in this case happens at step 222. The programming loaded by the resident processor has established that the global flag set to '1' will be indicative of at least one of the channels in group 1 having detected condition X. Now at step 232, channel 4 waits for condition Y. At step 234, condition Y has been detected and now channel 4 sets the global flag to '2'. Next at step 236, channel 4 is triggered. At the same time, step 224 receives the global flag set to '2' and channel 1 is also triggered at step 226.

Although the invention hereof has been described by way of example of a preferred embodiment, it will be evident that other adaptations and modifications may be employed without departing from the spirit and scope thereof. The terms and expressions employed herein have been used as terms of description and not of limitation; there is no intent of excluding equivalents and it is intended that the description cover any and all equivalents that may be employed without departing from the spirit and scope of the invention.

What is claimed is:

1. An integrated multi-channel analyzer for a communication network comprising:

at least three analyzer channels, each analyzer channel including:

at least an input connection port to the communication network;

a trace buffer memory; and logic circuitry that controls selective write operations of traces from the input connection port to the trace buffer memory in response to a status condition; and a high speed status bus operably connected to the logic circuitry of each analyzer channel, wherein the logic circuitry of each analyzer channel propagates the status condition for that analyzer channel to all other analyzer channels via the high speed status bus and the logic circuitry of each analyzer channel receives the status condition of all other analyzer channels and selectively incorporates the other status conditions as part of the status condition of that channel.

2. The integrated multi-channel analyzer of claim 1, wherein the communication network is a high bandwidth Fibre Channel communication network.

3. An integrated multi-channel analyzer for a communication network comprising:

a cabinet;
a processor housed within the cabinet having an external connection that receives high level commands for configuring and controlling the multi-channel analyzer;
at least three analyzer channels housed within the cabinet, each analyzer channel including:
   at least an input connection port to the communication network;
   a trace buffer memory; and
   logic circuitry controlling selective write operations of traces from the input connection port to the trace buffer memory in response to a status condition for that channel that selectively incorporates a status condition of any other analyzer channel as part of the status condition of that channel; and
a first high speed status bus operably connected to each of the analyzer channels to propagate the status condition for each analyzer channel to all other analyzer channels; and
a second bus operably connected between each of the analyzer channels and the processor to send low level commands from the processor to the analyzer channels and to receive the output of selective read operations of traces in the trace buffer memories within the processor.

4. The integrated multi-channel analyzer of claim 2 wherein the analyzer channels are configured as a pair of analyzer channels on an analysis logic card, the analysis logic card including:
   a pair of input connection ports and a pair of output connection ports to the communication network;
   a pair of trace buffer memories;
   a pair of channel logic circuits, each channel logic circuit controlling selective write operations of traces from one of the input connection ports to an associated one of the trace buffer memories in response to a status condition for that channel; and
   a set of local interconnections between the pair of channel logic circuits on each analysis logic card separate from the first status bus and the second bus such that the logic circuit of one channel can access the trace buffer memory and the input connection port and output connection port of the other channel.

5. The integrated multi-channel analyzer of claim 4 wherein the input connection port and the output connection port are configured on a front end module operably connected to the analysis logic card and wherein the front end module includes a converter module to interface the ports of a channel with the communication network and circuitry that automatically wraps the input connection port of one channel to the output port connection of the other channel.

6. The integrated multi-channel analyzer of claim 3, wherein the communication network is a high bandwidth Fibre Channel communication network.

7. An integrated multi-channel analyzer for a communication network comprising:
   a cabinet;
   at least three analyzer channels housed within the cabinet, each analyzer channel including:
      at least an input connection port to the communication network;
      a trace buffer memory; and
      logic circuitry that controls selective write operations of traces from the input connection port to the trace buffer memory in response to a status condition;
   a resident processor housed within the chassis; and
   a backplane electrically connecting the resident processor to the at least three analyzer channels, the backplane including a common clock signal whereby a single clock signal is utilized by the logic circuitry of all of the analyzer channels.

8. The integrated multi-channel analyzer of claim 7, wherein the communication network is a high bandwidth Fibre Channel communication network.

9. An integrated multi-channel analyzer for a communication network comprising:
   a cabinet;
   at least three analyzer channels housed within the cabinet, each analyzer channel including:
      at least an input connection port to the communication network;
      a trace buffer memory; and
      logic circuitry that controls selective write operations of traces from the input connection port to a selected trace buffer memory, the selected trace buffer memory determined by a buffer full flag communicated by each analyzer channel to all of the other analyzer channels.

10. The integrated multi-channel analyzer of claim 9, wherein the communication network is a high bandwidth Fibe Channel communication network.

11. An integrated multi-channel analyzer for a communication network comprising:
   at least three analyzer channels, each analyzer channel including:
      at least an input connection port to the communication network;
      a trace buffer memory; and
      means for distributively controlling the operation of the analyzer channel in response to a status condition that selectively incorporates status conditions from all of the other analyzer channels.

12. The integrated multi-channel analyzer of claim 11, wherein the communication network is a high bandwidth Fibre Channel communication network.

13. A method for controlling the operation of at least three analyzer channels for analyzing a communication network, each analyzer channel including an input connection port, a trace buffer memory and logic circuitry, the method comprising:
   a. connecting the input connection port of each analyzer channel to a unique node in the communication network;
   b. using the analyzer channels to monitor frame data on the connection port at each node;
   c. in response to a programmable first condition detected in the frame data by at least one of the analyzer channels, setting a first global flag that is communicated to all of the other analyzer channels;
   d. in response to the first global flag, initiating detection of a programmable second condition in the frame data by at least another of the analyzer channels;
   e. in response to the programmable second condition detected in the frame data by another of the analyzer channels, setting a second global flag that is communicated to all of the other analyzer channels; and
   f. in response to the second global flag, triggering at least some of the analyzer channels to store frame data in the trace buffer memories.

14. The method of claim 13, wherein the communication network is a high bandwidth Fibre Channel communication network.

15. A method for controlling the operation of analyzer channels for analyzing a communication network, each analyzer channel including an input connection port, a trace buffer memory and logic circuitry, the method comprising:

- a. connecting the input connection port of each analyzer channel to a unique node in the communication network;
- b. distributing a common clock signal to clock the logic circuitry of all of the analyzer channels;
- c. using the analyzer channels to monitor frame data on the connection port at each node;
- d. downloading selected frame data in the trace buffer memories into the memory of a processor also clocked by the common clock signal; and
- e. transmitting the selected frame data from the memory of the processor to a remote host computer.

16. The method of claim 15 wherein each analyzer channel includes a hardware search engine coupled to the trace buffer memory, and wherein the method further comprises:

- c1. using the hardware search engine to identify selected frame data.

17. The method of claim 16 further comprising:

- d1. initiating a time index of each of the trace buffer memories using the hardware search engine upon the completion of a trace; and
- d2. using the time index to identify selected frame data in the trace buffer memories for downloading.

18. The method of claim 15, wherein the communication network is a high bandwidth Fibre Channel communication network.

19. A method for controlling the operation of multiple analyzer channels for analyzing a communication network, each analyzer channel including an input connection port, a trace buffer memory and logic circuitry, the method comprising:

- a. connecting the input connection port of each analyzer channel to a unique node in the communication network;
- b. using the analyzer channels to monitor frame data on the connection port at each node;
- c. communicating a buffer full flag for each of the trace buffer memories to the logic circuitry of each of the analyzer channels; and
- d. storing frame data in a selected trace buffer memory for each analyzer channel in response to a status condition as determined by the logic circuitry for that channel, wherein the logic circuitry utilizes the buffer full flags to determine the selected trace buffer memory into which the frame data will be stored.

20. The method of claim 19, wherein the communication network is a high bandwidth Fibre Channel communication network.

* * * * *